United States Patent
Cross (10) Patent No.: US 6,649,954 B2
(45) Date of Patent: Nov. 18, 2003

(54) FERROELECTRIC CAPACITOR HAVING UPPER ELECTRODE LAMINATION

(75) Inventor: Jeffrey S. Cross, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/123,225

(22) Filed: Apr. 17, 2002

(65) Prior Publication Data

US 2003/0102500 A1 Jun. 5, 2003

(30) Foreign Application Priority Data

Dec. 4, 2001 (JP) ........................ 2001-369854

(51) Int. Cl.[7] ..................... H01L 31/113; H01L 31/119
(52) U.S. Cl. ....................................... 257/295
(58) Field of Search ............................. 257/295–310, 257/530–535; 438/3, 249–254, 396–398

(56) References Cited

U.S. PATENT DOCUMENTS 5,293,075 A * 3/1994 Onishi et al. ............... 257/295

FOREIGN PATENT DOCUMENTS

| JP | 41114541 | * | 5/1999 | ........... H01L/27/10 |
| JP | 11-195768 |   | 7/1999 | |
| JP | 2000-156471 |   | 6/2000 | |
| JP | 2000-208725 |   | 7/2000 | |
| JP | 2000-260954 |   | 8/2000 | |
| JP | 2000-349246 |   | 12/2000 | |
| JP | 3171110 |   | 3/2001 | |
| JP | 2001-144067 |   | 5/2001 | |
| JP | 2001-144264 |   | 5/2001 | |
| JP | 2001-196547 |   | 7/2001 | |

* cited by examiner

Primary Examiner—Cuong Quang Nguyen
(74) Attorney, Agent, or Firm—Armstrong, Westerman & Hattori, LLP

(57) ABSTRACT

A ferroelectric capacitor adapted for a non-volatile semiconductor memory comprises a base substrate with an insulating surface, such as a semiconductor substrate formed with semiconductor elements and having a top insulator film, a lower electrode formed on the insulating surface, an oxide ferroelectric layer formed on the lower electrode, a first oxide upper electrode formed on and in contact with the upper surface of the oxide ferroelectric layer, and a second oxide upper electrode formed on the first oxide upper electrode, wherein one of the first and second oxide upper electrodes comprises SRO that laminating a first and a second oxide upper electrodes onto said oxide contains at least 0.1 at % additive and the other of the first and second oxide upper electrodes comprises $IrO_x$. A non-volatile semiconductor memory or ferroelectric capacitor, having a PZT ferroelectric layer, excellent in characteristics, and capable of being manufactured efficiently, is provided.

13 Claims, 6 Drawing Sheets

| SRO Film (nm) | SRO Temp (°C) | SRO Gas | IrOx Temp (°C) | V90(10) (V) | Qsw(3V) (μCcm⁻²) | Leak(5V) (logAcm⁻²) | Fat(5V) 10° (%) | Q2,rate (3V) (%) | Q3,rate (3V) (%) | Q2(20) (3V) (μCcm⁻²) | Q3(20) (3V) (μCcm⁻²) |
|---|---|---|---|---|---|---|---|---|---|---|---|
| N/A | -- | -- | 300 | 2.9 | 28 | -3.0 | -1 | -12 | -8.9 | 9 | 14 |
| SPR | 2.5 | Ar | 300 | 3.1 | 27 | -2.3 | -5 | -10 | -8.2 | 9 | 15 |
| SPR | 300 | Ar/O₂ | 300 | 2.9 | 29 | -3.7 | -2 | -5.5 | -5.9 | 12 | 16 |
| SPR | 300 | Ar | 300 | 2.9 | 30 | -3.4 | -4 | -3.8 | -6.9 | 11 | 16 |
| S+RO | 25 | Ar | 300 | 2.8 | 30 | -3 | -5 | -8.9 | -5.8 | 11 | 16 |
| S+RO | 25 | Ar/O₂ | 300 | 2.7 | 29 | -3.2 | -3 | -12 | -7.6 | 9 | 16 |
| SRO | 25 | Ar | 300 | 3.0 | 31 | -4.5 | -3 | -1 | -6.3 | 13 | 18 |
| SRO | 300 | Ar/O₂ | 300 | 2.9 | 31 | -2.5 | -4 | 2.3 | -4.5 | 15 | 20 |

50 × 50 μm TEL

| SRO TARGET | ABBREVIATION | DENSITY |
|---|---|---|
| $SrRuO_3$ (KJC) | SRO | 65% |
| $Sr_{1.1}RuO_x$ (KJC) | S+RO | 65% |
| $Sr_{0.95}Pb_{0.1}RuO_x$ (VMC) | SPR | 80% |

FIG.5B

| SRO TARGET | SPUTTER GAS | TARGET POWER (W) | AVERAGE FILM CHARACTERISTICS ||||| 
|---|---|---|---|---|---|---|---|
| | | | Sr (at%) | Ru (at%) | Sr/Ru (Ratio) | DEPOSITION RATE (nm/s) | DENSITY (g/cm³) |
| $SrRuO_x$ | Ar | 350 | 50.3 | 49.7 | 1.01 | 0.32 | 5.9 |
| $Sr_{1.1}RuO_x$ | Ar | 700 | 53.2 | 47.8 | 1.14 | 0.63 | 5.8 |
| $Sr_{1.1}RuO_x$ | Ar | 350 | 52.6 | 47.4 | 1.11 | 0.30 | 5.8 |
| $Sr_{1.1}RuO_x$ | Ar/$O_2$ | 1400 | 51.8 | 48.2 | 1.08 | 0.64 | 5.1 |
| $Sr_{1.1}RuO_x$ | Ar/$O_2$ | 700 | 51.5 | 48.5 | 1.06 | 0.28 | 5.2 |

FIG.5C

| SPR SPUTTERING CONDITIONS (POWER, GAS, TEMPERATURE) | DEPOSITION RATE (nm/s) | Sr (%) | Pb (%) | Ru (%) | Sr/Ru |
|---|---|---|---|---|---|
| 350W Ar RT | 0.35 | 47 | 2.0 | 50 | 0.95 |
| 700W Ar RT | 0.66 | 48 | 1.5 | 51 | 0.94 |
| 700W Ar/$O_2$ RT | 0.23 | 47 | 2.5 | 50 | 0.93 |
| 1400W Ar/$O_2$ RT | 0.58 | 48 | 2.2 | 50 | 0.98 |
| 350W Ar 300°C | 0.37 | 50 | 1.3 | 50 | 1.00 |
| 700W Ar 300°C | 0.78 | 51 | 1.1 | 49 | 1.04 |
| 700W Ar/$O_2$ 300°C | 0.29 | 52 | 1.5 | 47 | 1.09 |
| 1400W Ar/$O_2$ 300°C | 0.64 | 51 | 1.4 | 49 | 1.04 |

FERROELECTRIC CAPACITOR HAVING UPPER ELECTRODE LAMINATION

CROSS REFERENCE TO RELATED APPLICATION

This application is based on and claims priority of Japanese patent application No. 2001-369854, filed on Dec. 4, 2001, the whole contents of which are incorporated herein by reference.

BACKGROUND OF THE INVENTION

A) Field of the Invention

This invention concerns a non-volatile semiconductor memory, a ferroelectric capacitor, and a ferroelectric capacitor manufacturing method, and in particular, concerns a non-volatile semiconductor memory with a ferroelectric capacitor, a ferroelectric capacitor with a laminated upper electrode, and a ferroelectric capacitor manufacturing method that makes use of sputtering.

B) Description of the Related Art

A ferroelectric random access memory (FeRAM) is a memory, which uses a ferroelectric capacitor that has a capacitor dielectric layer formed from a ferroelectric, is made non-volatile by the retention of polarization, and is made rewritable by the inversion of polarization.

Examples of the ferroelectric used include $Pb(Zr, Ti)O_3$ (PZT), $(Ba, Sr)TiO_3$ (BST), $Bi_{4-x}La_xTi_3O_{12}$ (BLT), $SrBi2Ta_2O_9$ (SBT), etc. Here, the expression (A, B) indicates $A h_x B_{1-x}$.

PZT, $Pb_{1-a}La_aZr_xTi_{1-x}Ti_{1-x}O_3$ (PLZT), $Pb_{1-a-b-c}La_aSr_bCa_cZr_xTi_{1-x}O_3$ (PLSCZT), etc., are ferroelectrics with perovskite crystal structures. In this Specification, these shall be referred to collectively as PZT ferroelectrics or PZT materials.

For the lower electrode and upper electrode that sandwich the ferroelectric layer, Pt, Ir, Ru, $SrRuO_x$ (SRO, though the stoichiometric composition is $SrRuO_3$, the expression, $SrRuO_x$ shall be used to include cases where the composition is not strictly stoichiometric), $LaNiO_3$ (LNO), (La, $Sr)CoO_3$ (LSCO), etc., which are strong in resistance against reducing atmospheres containing $H_2$, are used. Among these, SRO, LNO and LSCO have perovskite crystal structures.

As with other devices, a higher degree of integration, increased speed, and lower power supply voltage are being demanded for FeRAM's as well. It is being desired that the power supply voltage be less than 3V. With an FeRAM that uses PZT for the ferroelectric layer of the ferroelectric capacitor, the thickness of the ferroelectric layer must be made no more than 100 nm in order to decrease the power supply voltage.

As the layer thickness of a ferroelectric layer is decreased, the minimum electric field (coercive field Ec) necessary for inverting the polarization of the ferroelectric capacitor increases, especially when metal electrodes are used. It is considered that the coercive field increases due to increased contribution of the interface with a decrease in the ferroelectric layer thickness. It is desired that excellent contact be formed and the occurrence of interfacial stress be avoided.

Priorly, Pt electrodes were often used as the electrodes of a PZT ferroelectric capacitor. Pt exhibits a catalytic action and has the function of decomposing hydrogen into protons. When protons are generated, the protons diffuse into the PZT layer and degrade the ferroelectricity. However, even in the case where Pt electrodes are used, the catalytic action can be reduced significantly by covering the Pt layer with another layer.

As with PZT, SRO has a perovskite structure. The use of SRO as an upper electrode is effective for excellent contact formation and reduction of distortion. Among the raw materials for SRO, Ru is an expensive raw material. Thus for the reduction of manufacturing cost, it is desired that the consumption of Ru be decreased.

In the case where an SRO target for sputtering is to be formed from sintered ceramic, it is difficult to increase the density of the SRO target. The density of an ordinary ceramic SRO target is approximately 65% at the most. A low density target not only causes the lifetime to be short but also causes particle generation.

Sr also has a low rate of etching by chlorine or other halogen etching gas, and it is therefore not easy to etch SRO chemically.

For ferroelectric capacitors that use a ferroelectric layer, electrodes that can form an excellent interface with the ferroelectric layer are needed.

The making of the lifetime of the SRO target long and the reduction of the cost of manufacture are also required.

SUMMARY OF THE INVENTION

An object of this invention is to provide a non-volatile semiconductor memory and a ferroelectric capacitor, which has excellent performance and can be manufactured efficiently.

Another object of this invention is to provide a method of manufacturing a ferroelectric capacitor and a non-volatile semiconductor memory by which a ferroelectric capacitor with excellent characteristics can be manufactured efficiently.

A further object of this invention is to provide a new art regarding a ferroelectric capacitor and a non-volatile semiconductor memory.

An aspect of this invention provides a non-volatile semiconductor memory comprising a base substrate having an insulating surface; a lower electrode formed on said insulating surface; an oxide ferroelectric layer formed on said lower electrode, a first oxide upper electrode formed on and in contact with an upper surface of said oxide ferroelectric layer; and a second oxide upper electrode formed on said first oxide upper electrode, wherein one of said first and second oxide upper electrodes comprises SRO that contains at least 0.1 at % additive and other of said first and second oxide upper electrodes comprises $IrO_x$.

Another aspect of this invention provides a ferroelectric capacitor manufacturing method comprising the steps of (a) forming a lower electrode on a base substrate having an insulating surface;(b) forming an oxide ferroelectric layer on said lower electrode; and (c) depositing a first and a second oxide upper electrodes onto said oxide ferroelectric layer by sputtering wherein one of said first and second oxide upper electrodes is sputtered using a target that comprises SRO ceramic that has an increased density by adding at least 0.1 at % additive and the other of said first and second oxide upper electrodes is sputtered using a target comprising of Ir.

A further aspect of this invention provides a ferroelectric capacitor, comprising a base substrate having an insulating surface; a lower electrode formed on said insulating surface; an oxide ferroelectric layer formed on said lower electrode, a first oxide upper electrode formed on and in contact with an upper surface of said oxide ferroelectric layer; and a second oxide upper electrode formed on said first oxide upper electrode, wherein one of said first and second oxide upper electrodes comprises $CaRuO_x$ or $LaRuO_x$ that contains at least 0.1 at % additive and other of said first and second oxide upper electrodes comprises $IrO_x$.

A non-volatile semiconductor with excellent characteristics can thus be manufactured efficiently. Since an SRO layer is sputtered, the lifetime of the target can be increased. The cost of manufacture of the ferroelectric capacitor can also be reduced.

DESCRIPTION OF THE PREFERRED EMBODIMENTS

Prior to the description of the preferred embodiments, an analysis carried out by the present inventors shall be described.

Figure 5A:
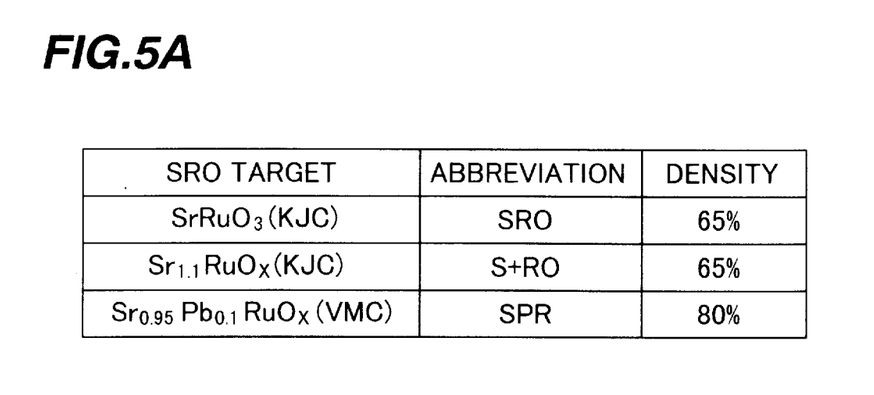
FIGS. 5B, 5B, and 5C are tables that show the results of preliminary experiments.

FIG. 5A shows the densities of various SRO ceramic targets. Though the density of bulk SRO is 6.5 g/cm³, the density of an SRO ceramic target with a stoichiometric composition that has been formed by sintering is 65% at the most. This target shall be abbreviated hereinafter as SRO.

In order to reduce the amount of expensive Ru, an SRO target with an $Sr_{1.1}RuO_x$ composition, which is 10% increased in Sr with respect to the stoichiometric composition, was formed. The density of this target was also 65% at the most. This target shall be abbreviated hereinafter as S+RO. Targets made by Kojundo Chemical Laboratory Co., Ltd. (KJC) were used as the SRO and S+RO targets. The Sr and Ru compositions of SRO can be changed with respect to the stoichiometric composition. However, it is preferable that the change be kept within a range of 5 to 25%.

The present inventors considered the addition of Pb to the SRO target. An $Sr_{0.95}Pb_{0.1}RuO_x$ ceramic target, with which Pb is added and the Sr composition is changed slightly with respect to the stoichiometric composition, was formed. The density of this target was improved to 80%. This target shall be abbreviated hereinafter as SPR. A target made by Vacuum Metallurgical Co., Ltd. (VMC) was used as this target.

With a PZT ferroelectric, the crystallinity can be promoted by making the Pb composition excessive. However, Pb is also a cause of high leakage current in the capacitor. It is preferable for the Pb composition to be low in order to avoid diffusion of Pb from the SRO layer into the PZT ferroelectric layer. When a PZT ferroelectric layer is formed by chemical vapor deposition (CVD), excellent crystallinity can be achieved even when the excess Pb quantity is restrained. In the case where the excess Pb quantity in the PZT ferroelectric layer is low, the influence of Pb will be low even if the SRO contains some Pb.

It has become known that the density of a ceramic target can be improved by adding Pb as an additive besides the constituent elements of SRO and adjusting the composition as necessary. In addition to Pb, Bi and Cu are also additives by which the density can be improved. A quantity of at least 0.1% is necessary as the quantity to be added to a target. A quantity of 5 at % or less is preferable for the maintaining of the inherent characteristics. A quantity of approximately 2 at % or less is even more preferable.

Using these targets, SRO layers were sputtered and their characteristics were examined. Elemental analyses were carried out by inductive coupling plasma atomic emission spectroscopy (ICP-AES) and X-ray reflectivity and X-ray fluorescence (XRR-XRF). The instrument used was Technos SMAT210.

A thermal oxide film was formed on a (100) Si substrate surface and an SRO film was sputtered onto this thermal oxide film using a 12-inch diameter ceramic target. With regard to the sputtering conditions, Ar or a mixed gas of Ar+$O_2$ was used as the sputter gas and DC target powers of 350 W, 700 W, and 1400 W were used. The substrate temperature was set to room temperature or set to 300° C. by lamp heating.

With the sputtering of an oxide, the oxygen in the deposited layer tends to decrease. Reactive sputtering using a mixed gas of Ar +$O_2$ is effective for supplementing the deficient oxygen. The deposited layer may also be annealed in an oxygen-containing atmosphere after sputtering.

SRO films that were sputtered using the SRO target and the S+RO target shall be described first. The Sr and Ru compositions in the SRO films were examined.

Figure 5B:
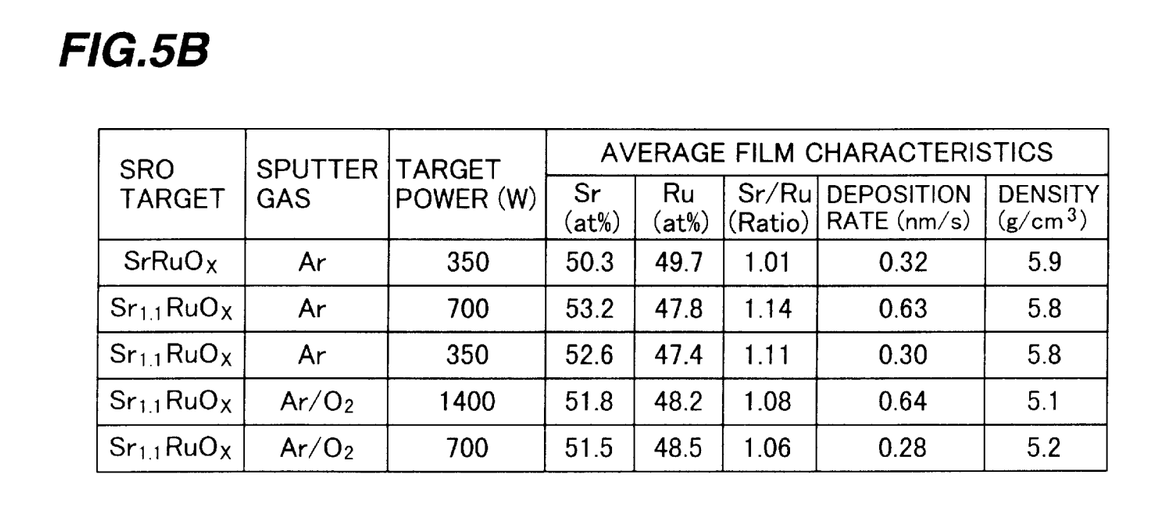

As shown in FIG. 5B, the compositions of the deposited films were substantially equivalent to the compositions of the targets. Basically, when a non-stoichiometric target is used, a non-stoichiometric deposited film is formed. When the S+RO target was used, the Sr/Ru ratio increased to approximately 1.1 in accordance to the target composition. The deposition rate exhibits a trend of being substantially proportional to the target power. When the sputter gas is changed from Ar to Ar+$O_2$, the deposition rate decreased to approximately one-half. Also when Ar+$O_2$ is used as the sputter gas, the density of the sputtered SRO layer decreased.

Figure 5C:
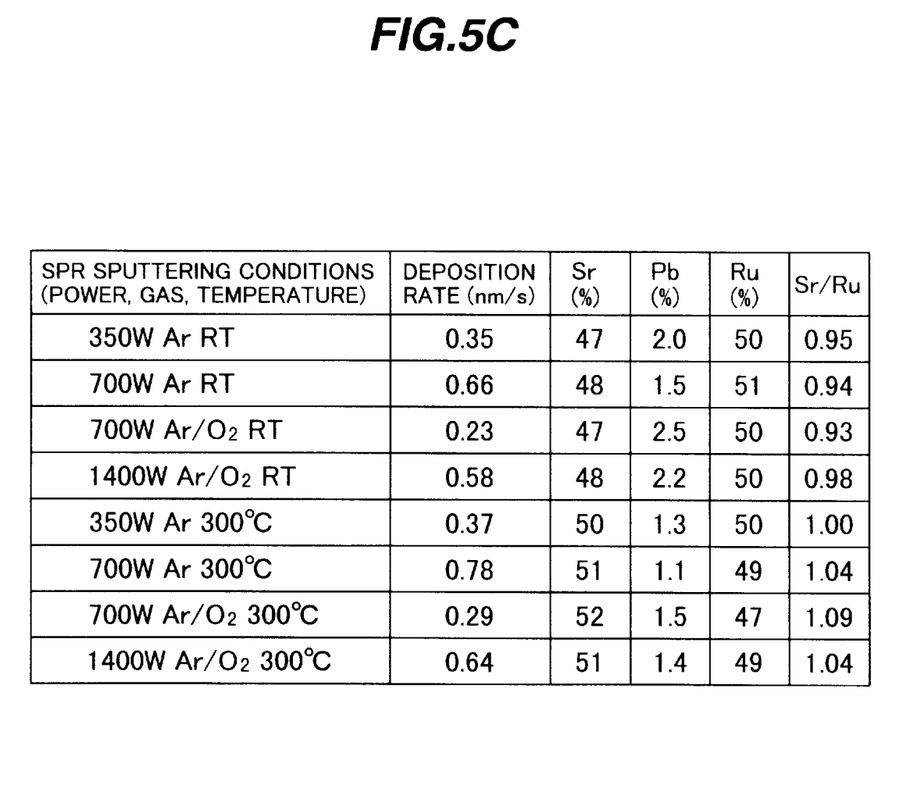

FIG. 5C shows the results for the case where an SPR target of an $Sr_{0.95}Pb_{0.1}RuO_x$ composition, with which Pb was added and the density was improved, was used. Basically, a non-stoichiometric sputtered film is formed in accordance to the non-stoichiometric character of the target. The added quantity of Pb is approximately 2 at % with respect to the total composition. The deposition rate was equal to or greater than those of the SRO target and S+RO target. The Pb that was added to the target was decreased in concentration in the deposited layer. When Pb is added to SRO, the target density can be improved and a deposited layer can be obtained with which the influence of the added Pb is reduced.

Furthermore by heating to 300° C., the Pb concentration in the deposited layer was reduced clearly. The influence of the additive can thus be reduced further by heating. However, 0.1 at % or more of the additive will still be contained in the deposited layer. It is considered preferable to heat to 200° C. or higher in order to reduce the Pb concentration in the sputtered SRO layer.

It can be seen that though the Sr/Ru ratio substantially corresponds to the target composition when sputtering is performed onto a substrate at room temperature, when heating to 300° C. is performed, the Sr/Ru ratio increases. It should be possible to obtain a substantially stoichiometric Sr/Ru ratio by appropriate selection of the sputtering conditions.

Since an SPR target has improved density, it has a longer target lifetime. The target density can also be improved when Bi or Cu is added. 0.1 at % or more of the additive will be contained in the deposited layer.

The above preliminary examination showed that by using a ceramic target that is an SRO target with which the density has been improved by the addition of Pb, the target lifetime can be made long and a high-quality SRO layer can be formed.

Figure 1A:
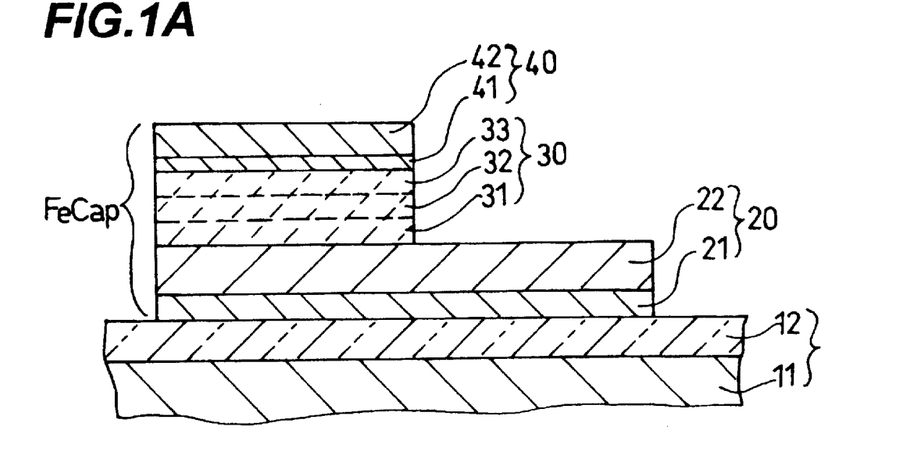
FIGS. 1A, 1B and 1C are schematic sectional views and a schematic plan view for explaining the ferroelectric capacitor manufacturing method of an embodiment of the invention.
Figure 1B:
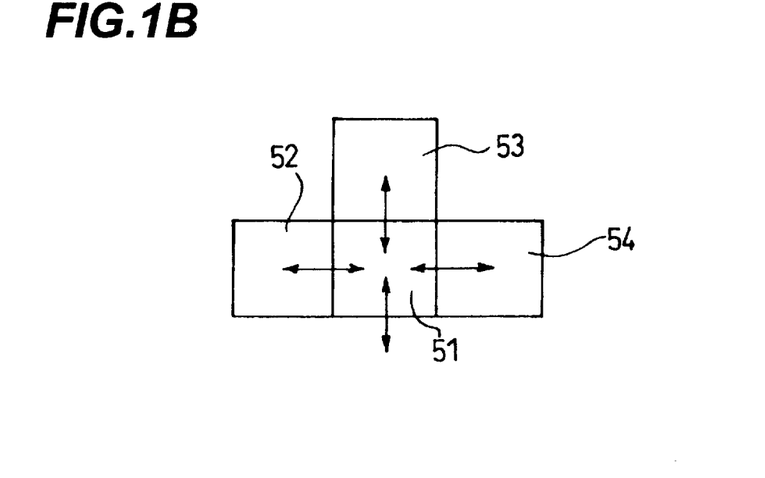
Figure 1C:
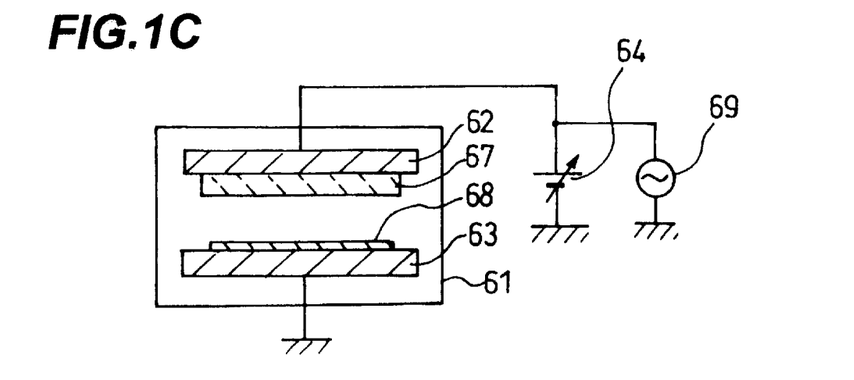

FIGS. 1A, 1B, and 1C are a schematic sectional view of ferroelectric capacitor, a schematic plan view of a sputter device, and a schematic sectional view of a sputter chamber for explaining the ferroelectric capacitor manufacturing method of an embodiment of this invention.

As shown in FIG. 1A, a TEOS Si oxide film 12 of approximately 100 nm thickness is formed on the surface of an Si substrate to thereby prepare a base substrate 10. A ferroelectric capacitor FeCap is formed on this base substrate 10. The lower electrode 20 and upper electrode 40 of the ferroelectric capacitor are prepared by sputtering.

As shown in FIG. 1B, the sputtering device has three sputter chambers 52, 53, and 54 that surround a load lock chamber 51. The three sputter chambers 52, 53, and 54 are equipped with an Ir target, Pt target, and SRO target as targets.

FIG. 1C shows the arrangement of each sputter chamber in a schematic manner. Counter electrodes 62 and 63 are deposited inside a reaction chamber 61 and a sputtering target 67 is fixed onto the lower surface of the upper electrode 62. Base substrate 68 is set on the lower electrode 63. A DC voltage is applied across lower electrode 63 and upper electrode 62 from a DC power supply 64. RF power from an AC power supply 69 can also be supplied across the counter electrodes 62 and 63.

First, an $IrO_x$ layer 21 of approximately 50 nm thickness is deposited onto base substrate 10 at room temperature by reactive sputtering using a mixed gas of $Ar+O_2$. After forming the IrO, layer, the base substrate is heated to 400° C. under $O_2$ gas flow for annealing.

A Pt film 22 of approximately 150 nm thickness is then sputtered from the Pt target using Ar gas and a sputter power of 1 kW. By deposition of $IrO_x$ layer 21 and Pt layer 22, the lower electrode 20 is formed.

Next, using a PLCSZT (110/2/5/2/45/55) chemical solution deposition (CSD) solution, which is available from Kanto Chemicals Co., Ltd., a PLCSZT layer 31 is spin coated onto Pt layer 22 and then thermally decomposed at 350° C. When a PZT ferroelectric layer is formed on Pt layer 22, the (111) orientation is made dominant by process optimization. The Pt layer can also be formed to be excellent in electrical contact with the PZT ferroelectric layer.

By repeating the spin coating and thermal decomposition two more times, PLCSZT layers 32 and 33 are laminated, thereby forming a PLCSZT ferroelectric layer 30 with a total layer thickness of 135 nm. Thereafter, the PLCSZT ferroelectric layer 30 that has been formed is annealed at 700° C. for 2 minutes in an $O_2$ gas flow and crystallization is thereby promoted. The ferroelectric layer may be formed by sputtering or chemical vapor deposition (CVD).

An SRO layer 41 of approximately 15 nm thickness is formed on ferroelectric layer 30 by sputtering from an SRO target. An $IrO_x$ layer 42 of approximately 75 nm thickness is furthermore formed on top by sputtering from an Ir target at a substrate temperature of 300° C. When an oxide electrode is formed on a PZT ferroelectric layer, the increase of the coercive field can be reduced. By providing a layered structure, the disadvantages of SRO can be compensated for. Upper electrode 40 is formed in this manner. $IrO_x$ has a tetragonal crystal structure.

The SRO layer deposition can be performed at room temperature or upon heating the substrate. In the case where the SRO layer is to be sputtered onto a heated substrate, the heating temperature is preferably set to 800° C. or less. The substrate may be heated after performing deposition at room temperature. If heating is to be performed after deposition, the heating temperature is preferably set to 500 to 800° C. Also, heating may be performed after forming the oxide laminated electrode.

With the above-described arrangement, the upper electrode and lower electrode are formed by deposition. The upper electrode forms an asymmetric arrangement along with the lower electrode. The upper electrode is fabricated by deposition of an oxide conductive layer.

For comparison of the characteristics, the lower SRO layers of laminated oxide electrodes were formed using three different targets SRO, S+RO, and SPR. A sample using a single-layer $IrO_x$ layer of 75 nm thickness as the upper electrode was also formed.

The SRO layer was DC sputtered using Ar gas and at a sputter power of 350 W. DC sputtering was also performed upon changing the sputtering conditions, that is, using a mixed $Ar/O_2$ gas containing 10% $O_2$ and a target power of 700 W. Room temperature and 300° C. were used as substrate temperatures.

Figure 2A:
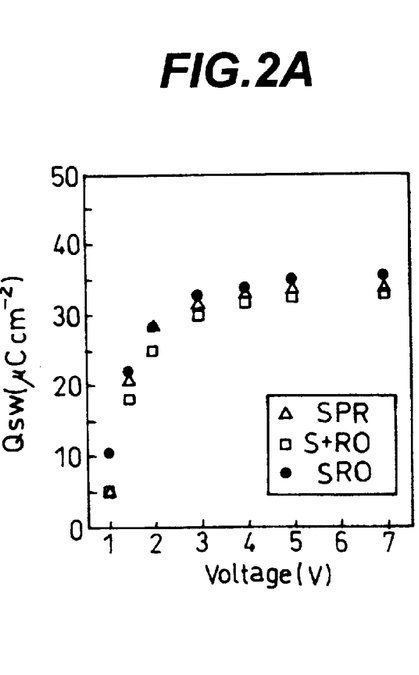
FIGS. 2A, 2B, and 2C are graphs, which show the characteristics of the ferroelectric capacitors that have been prepared.

FIG. 2A shows, in units of $\mu Ccm^{-2}$, the switching polarization $Q_{SW}$ with respect to application voltage of the ferroelectric capacitors that have been prepared. The voltage was ramped up to 10 V. As shown in the figure, the three types of capacitors exhibit substantially equivalent switching polarization characteristics and a low saturation voltage, V90. A high $Q_{SW}$ can be obtained at an operating voltage of 3V.

Figure 2B:
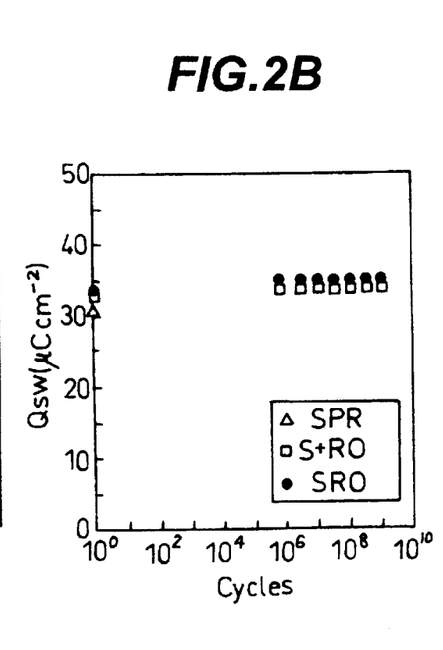

FIG. 2B shows the switching polarization $Q_{SW}$ for repeated switching. For the three types of sample, excellent repeated switching characteristics, with little degradation up to $10^9$ times of switching, were obtained.

Figure 3:
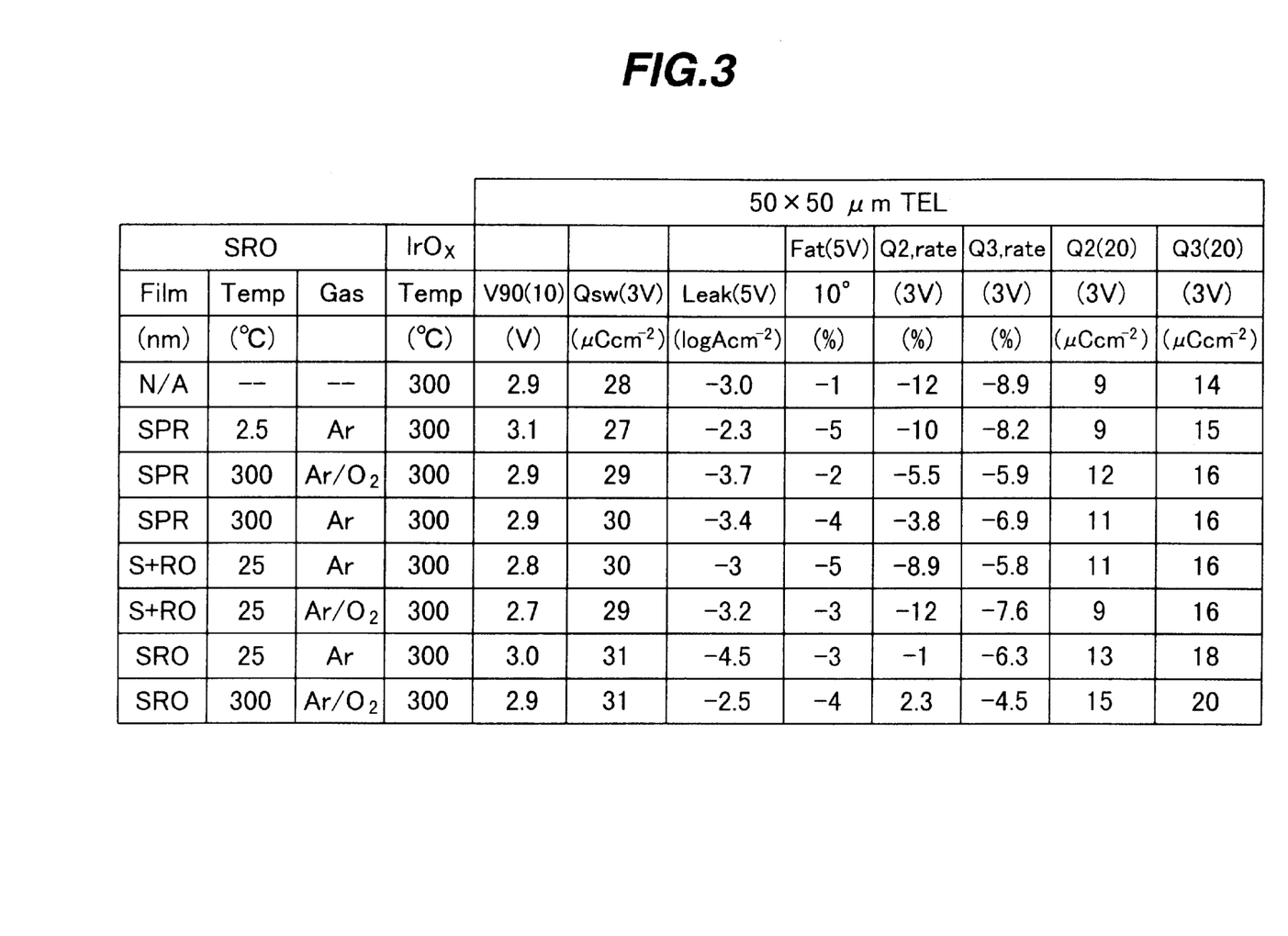
FIG. 3 is a table, which shows the characteristics of the ferroelectric capacitors that have been prepared.

FIG. 3 is a table that summarizes the experimental results, including the above-described results. The SRO sputtering conditions are shown in the "SRO" column and the $IrO_x$ column shows the $IrO_x$ sputtering conditions. "V90(10)" indicates the saturation voltage V90 when up to 10V was applied. "Qsw(3V)" indicates the polarization variation amount $Q_{SW}$ when switching at 3V was performed. "Leak (5V)" indicates the leak current $A/cm^2$ (amperes) when 5V is applied. "Fat(5V)" indicates the fatigue upon alternate application of +5V and −5V pulses. "Q2" and "Q3" indicate the retention and imprint. The "rate" indicates the rate of change and the "20" in parenthesis indicates 20 hours of baking.

The memory retention function was satisfactory, the leak current was low, and the fatigue was also low. Imprinting and temporal change were also low.

Figure 2C:
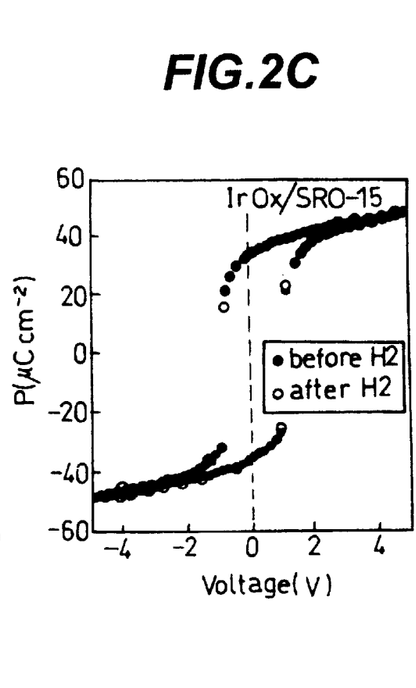

FIG. 2C shows the hysteresis characteristics before and after $H_2$ annealing. Only the hysteresis characteristics of the sample using the SPR target are shown in the figure. The hysteresis characteristics are hardly changed before and after $H_2$ annealing, that is, excellent $H_2$ resistance characteristics were obtained. It can be understood that electrical characteristics that are substantially equivalent to those obtained using the SRO target were obtained by use of the SPR target.

A ferroelectric capacitor, which uses an SRO layer sputtered from an SPR target as the upper electrode and has a satisfactory interface, has thus been prepared. The lifetime of the target can also be increased.

With the upper electrode 40 of the actually prepared sample, an SRO film was used as the first upper electrode 41 and an $IrO_x$ film was used as second upper electrode 42. Excellent characteristics can be obtained even when the order of formation is inverted. Also, though a bi-layer electrode of $Pt/IrO_2$ was used as the lower electrode, a lower electrode of another arrangement may also be used.

Figure 4A:
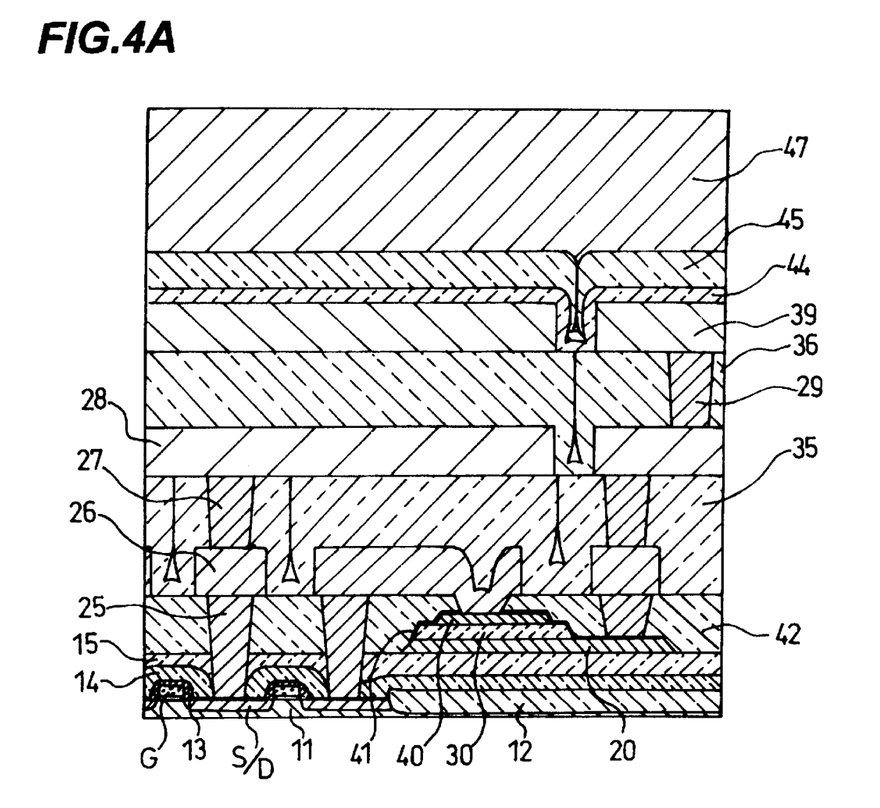
FIGS. 4A and 4B are sectional views, which show arrangements of non-volatile semiconductor memories with ferroelectric capacitors.

FIG. 4A schematically shows the arrangement of the case where a non-volatile semiconductor memory is formed using a ferroelectric capacitor such as that described above.

An arrangement example where electrical contacts are formed from above on the lower electrode and upper electrode of a ferroelectric capacitor is shown. As shown in the figure, an element separation region 12 of silicon oxide, etc., is formed by LOCOS or shallow trench isolation on the surface of a p-type Si substrate 11. An insulating gate electrode G, formed by lamination of a gate insulator film, a polycrystalline silicon layer, and a silicide layer, is prepared on the surface of the active region. A side wall spacer 13 is formed from silicon oxide, etc., on the side wall of gate electrode G. An n-type source/drain region S/D is formed on both sides of the gate electrode.

An SiON layer 14 is formed to cover the transistor that has been prepared. The SiON layer 14 protects the parts below it against reducing atmospheres, etc., in the ferroelectric capacitor manufacturing process. A silicon oxide layer 15 is formed above the protective layer 14 and the surface thereof is flattened by chemical mechanical polishing (CMP).

A ferroelectric capacitor, formed from lower electrode 20, ferroelectric layer 30, and upper electrode 40 of the above-described arrangements, is formed on the surface of silicon oxide layer 15, and the surface of the ferroelectric capacitor is covered with an encapsulation layer 41, such as an $Al_2O_3$ layer, etc., which has a hydrogen barrier function. A silicon oxide layer 42 that covers the $Al_2O_3$ layer 4 is formed and the surface thereof is flattened by CMP.

An opening that extends from the surface of silicon oxide layer 42 to the silicon substrate and the lower electrode is formed and a W plug 25 is formed by blanket W layer deposition and chemical mechanical polishing (CMP). A barrier layer of TiN, TaN, etc., is preferably deposited prior to W layer deposition.

After forming an opening that exposes the upper electrode, an Al wiring layer 26 is formed and patterned to form wiring 26. A silicon oxide layer 35 that covers Al wiring layer 26 is formed and the surface thereof is flattened. A connection hole is formed in silicon oxide layer 35 and a W plug 27, having W embedded therein, is formed. An Al layer is formed on the surface of silicon oxide layer 35 and patterned to form wiring 28.

Silicon oxide layer 36, W plug 29, and wiring 39 are furthermore formed, and a pad silicon oxide layer 44 and a pad silicon nitride layer 45 are deposited onto the surface. A polyimide insulator layer 47 is furthermore formed above the silicon nitride layer 45. A non-volatile semiconductor memory with multilayer wiring is thus formed.

Figure 4B:
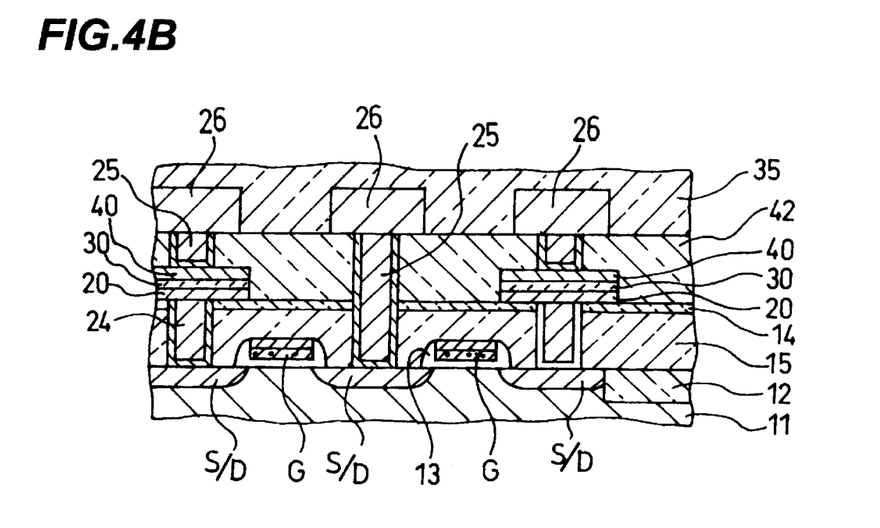

FIG. 4B shows an arrangement example where the contact for the lower electrode of the ferroelectric capacitor is formed at the lower side. The parts that are the same as those of the arrangement of FIG. 4A shall be provided with the same symbols to simplify the description.

A MOS transistor structure is formed on an Si substrate, and after forming a silicon oxide layer 15 that covers the surface, a protective layer 14 of silicon nitride, etc., which has an oxygen shielding function, is formed on top. After forming a contact hole that passes through the silicon nitride protective layer 14 and the silicon oxide layer 15 in the capacitor forming region, a plug 24 is formed by lamination for example of TiN and W. A ferroelectric capacitor having lower electrode 20, ferroelectric layer 30, and upper electrode 40 is formed on this plug. A silicon oxide layer 42 that covers the ferroelectric capacitor is formed and the surface thereof is flattened. A connection hole that extends from silicon oxide layer 42 to upper electrode 40 and source/drain region S/D is formed and a TiN/W plug 25 of the same arrangement as described above is formed. An Al wiring 26 is furthermore formed on the surface and is covered by a silicon oxide layer 35.

Though this invention has been described above by way of embodiments, this invention is not limited thereto. Though the case where an SRO layer is used as one of the laminated upper electrodes was described, $CaRuO_3$ and $LaRuO_3$ are Ru oxides with the same perovskite crystal structure as $SrRuO_3$, and thus the same effects as an $SrRuO_x$ layer can be anticipated by use of a $CaRuO_x$ layer or an $LaRuO_x$ layer. $LaNiO_3$ and $(La, Sr)CO_3$ are also oxides with perovskite crystal structures and the same effects can be anticipated with these oxides as well.

Though the case where a PZT ferroelectric layer is employed as the ferroelectric layer was described, the same effects can be anticipated with the use of other ferroelectric layers, especially a $BiLaTiO_x$ layer or a $(Ba, Sr)TiO_x$ layer.

The lower electrode also is not limited to the above-described arrangement and various types of known arrangements can be employed. However, the lower electrode and upper electrode preferably have an asymmetric arrangement. Also, a substrate besides a semiconductor substrate may be used as the substrate.

That various modifications, improvements, combinations, etc., are also possible besides the above should be clear to those skilled in the art.

I claim:

1. A ferroelectric capacitor, comprising:
   a base substrate having an insulating surface;
   a lower electrode formed on said insulating surface;
   an oxide ferroelectric layer formed on said lower electrode,
   a first oxide upper electrode formed on and in contact with an upper surface of said oxide ferroelectric layer; and
   a second oxide upper electrode formed on said first oxide upper electrode,
   wherein one of said first and second oxide upper electrodes comprises SRO that contains at least 0.1 at % additive and other of said first and second oxide upper electrodes comprises $IrO_x$.

2. The ferroelectric capacitor as set forth in claim 1, wherein said SRO has a composition that is deviant from stoichiometric composition in regard to Sr and Ru.

3. The ferroelectric capacitor as set forth in claim 1, wherein said additive contains at least one element selected from the group consisting of Pb, Bi, and Cu.

4. The ferroelectric capacitor as set forth in claim 1, wherein said oxide ferroelectric layer is formed of PZT-base ferroelectric having perovskite structure, said one of the oxide upper electrodes has a perovskite structure, and
   said other oxide upper electrode has a tetragonal structure.

5. The ferroelectric capacitor as set forth in claim 1, wherein said oxide ferroelectric layer is formed of at least one material selected from the group constituting of PZT-base ferroelectrics, BiLaTiO$_x$, and (Ba, Sr)TiO$_x$.

6. A ferroelectric capacitor, comprising:

a base substrate having an insulating surface;

a lower electrode formed on said insulating surface;

an oxide ferroelectric layer formed on said lower electrode, a first oxide upper electrode formed on and in contact with an upper surface of said oxide ferroelectric layer; and a second oxide upper electrode formed on said first oxide upper electrode, wherein one of said first and second oxide upper electrodes comprises CaRuO$_x$ or LaRuO$_x$ that contains at least 0.1 at % additive and other of said first and second oxide upper electrodes comprises IrO$_x$.

7. A ferroelectric capacitor, comprising:

a base substrate having an insulating surface;

a lower electrode formed on said insulating surface;

an oxide ferroelectric layer formed on said lower electrode;

a first oxide upper electrode formed on and in contact with the upper surface of said oxide ferroelectric layer, and a second oxide upper electrode formed on said first oxide upper electrode, wherein one of said first and second oxide upper electrodes comprises LaNiO$_x$ or (La, Sr)CO$_x$ that contains at least 0.1 at % additive and other of said first and second oxide upper electrodes comprises IrO$_x$.

8. A non-volatile semiconductor memory, comprising:

a semiconductor substrate formed with semiconductor elements and having an insulator film at a surface;

a lower electrode formed on said insulator film;

an oxide ferroelectric layer formed on said lower electrode;

a first oxide upper electrode formed on and in contact with upper surface of said oxide ferroelectric layer; and a second oxide upper electrode formed on said first oxide upper electrode, wherein one of said first and second oxide upper electrodes comprises SRO that contains at least 0.1 at % additive and other of said first and second oxide upper electrodes comprises IrO$_x$.

9. The non-volatile semiconductor memory as set forth in claim 8, wherein said SRO has a composition that is deviant from stoichiometric composition in regard to Sr and Ru.

10. The non-volatile semiconductor memory as set forth in claim 8, wherein said additive contains at least one element selected from the group consisting of Pb, Bi, and Cu.

11. The non-volatile semiconductor memory as set forth in claim 8, wherein said oxide ferroelectric layer is formed of PZT-base ferroelectric having perovskite structure, said one of the oxide upper electrodes has a perovskite structure, and said other oxide upper electrode has a tetragonal structure.

12. A non-volatile semiconductor memory, comprising:

a semiconductor substrate forming with semiconductor elements and having an insulator film at a surface;

a lower electrode formed on said insulator film;

an oxide ferroelectric layer formed on said lower electrode;

a first oxide upper electrode formed on and in contact with upper surface of said oxide ferroelectric layer; and a second oxide upper electrode formed on said first oxide upper electrode, wherein one of said first and second oxide upper electrodes comprises CaRuO$_x$ or LaRuO$_x$ that contains at least 0.1 at % additive and other of said first and second oxide upper electrodes comprises IrO$_x$.

13. A non-volatile semiconductor memory comprising:

a semiconductor substrate formed with semiconductor elements and having an insulator film at a surface;

a lower electrode formed on said insulator film;

an oxide ferroelectric layer formed on said lower electrode;

a first oxide upper electrode formed on and in contact with upper surface of said oxide ferroelectric layer; and a second oxide upper electrode formed on said first oxide upper electrode, wherein one of said first and second oxide upper electrodes comprises LaNiO$_x$ or (La, Sr)CO$_x$ that contains at least 0.1 at % additive and the other of said first and second oxide upper electrodes comprises IrO$_x$.

* * * * *